US008629673B1

(12) United States Patent
Xie

(10) Patent No.: US 8,629,673 B1
(45) Date of Patent: Jan. 14, 2014

(54) POWER DETECTION FOR HIGH POWER AMPLIFIER APPLICATIONS

(75) Inventor: Chenggang Xie, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 371 days.

(21) Appl. No.: 12/975,636

(22) Filed: Dec. 22, 2010

(51) Int. Cl.
G01R 1/44 (2006.01)

(52) U.S. Cl.
USPC .......................................... 324/105

(58) Field of Classification Search
USPC .......................................... 324/105
See application file for complete search history.

(56) References Cited

U.S. PATENT DOCUMENTS

| | | | | |
|---|---|---|---|---|
| 3,253,221 A * | 5/1966 | Peckover | ................. | 324/762.08 |
| 5,477,188 A * | 12/1995 | Chawla et al. | ................. | 330/269 |
| 5,541,554 A * | 7/1996 | Stengel et al. | ................. | 330/51 |
| 5,655,375 A * | 8/1997 | Ju | ................. | 62/3.6 |
| 5,754,402 A * | 5/1998 | Matsuzaki et al. | ........... | 361/707 |
| 6,194,968 B1 * | 2/2001 | Winslow | ................. | 330/289 |
| 6,483,371 B1 * | 11/2002 | Duthie et al. | ................. | 327/512 |
| 6,844,782 B2 * | 1/2005 | Otaka | ................. | 330/254 |
| 6,952,130 B2 * | 10/2005 | Kuyel et al. | ................. | 330/9 |
| 6,958,649 B2 * | 10/2005 | Nagamori et al. | ........... | 330/133 |
| 7,075,368 B2 * | 7/2006 | Lin et al. | ................. | 330/254 |
| 7,342,455 B2 * | 3/2008 | Behzad et al. | ................. | 330/289 |
| 7,893,763 B2 * | 2/2011 | Andrews | ................. | 330/136 |
| 8,258,874 B2 * | 9/2012 | Van Zyl | ................. | 330/297 |
| 2002/0125945 A1 * | 9/2002 | Taylor | ................. | 330/129 |
| 2004/0090267 A1 * | 5/2004 | Nagamori et al. | ........... | 330/133 |
| 2004/0125713 A1 * | 7/2004 | Takahashi et al. | ......... | 369/44.34 |
| 2006/0214730 A1 * | 9/2006 | Yamakawa et al. | ........... | 330/289 |
| 2008/0186094 A1 * | 8/2008 | Lee | ................. | 330/131 |
| 2008/0238550 A1 * | 10/2008 | Sasaki et al. | ................. | 330/277 |
| 2010/0311362 A1 * | 12/2010 | Lee et al. | ................. | 455/118 |
| 2011/0187461 A1 * | 8/2011 | Mochizuki | ................. | 330/310 |
| 2011/0193628 A1 * | 8/2011 | Pukhovski | ................. | 330/127 |

* cited by examiner

Primary Examiner — Jermele M Hollington
Assistant Examiner — Demetrius Pretlow
(74) Attorney, Agent, or Firm — Donna P. Suchy; Daniel M. Barbieri

(57) ABSTRACT

A system for determining an amount of power supplied from a power amplifier may include a power amplification circuit having a characteristic thermal resistance, a first temperature sensor for sensing a first temperature associated with the power amplification circuit when the power amplification circuit is receiving power from the power source, a second temperature sensor for sensing a second temperature associated with an environment occupied by the power amplification circuit, and a processor coupled with the first temperature sensor and the second temperature sensor for determining an amount of power dissipation utilizing (A) a temperature difference determined utilizing the first temperature and the second temperature and (B) the characteristic thermal resistance of the power amplification circuit.

16 Claims, 4 Drawing Sheets

POWER DETECTION FOR HIGH POWER AMPLIFIER APPLICATIONS

TECHNICAL FIELD

The present disclosure generally relates to the field of power amplification, and more particularly to a device, system, and method for determining an amount of power supplied from a power amplification circuit.

BACKGROUND

Radio Frequency (RF) power detection for power amplifiers may typically be performed utilizing a directional coupler and an Integrated Circuit (IC) RF power sensor to measure the forward power from a power amplifier and the reflected power from an antenna, or the like. However, this technique may have several shortcomings, especially in the case of high power, ultra-broadband amplifier applications. For example, in the case of ultra-wide band amplification, three or more couplers may be needed to cover a range such as 30-6,000 megahertz (MHz). Also, such couplers may have an insertion loss between 0.3 and one decibel (dB). Further, if a switch is added to the circuit, the loss may be increased by another 0.5 dB or more. Additionally, adding couplers between an amplifier and an antenna may increase the space occupied by such a system, as well as its cost.

SUMMARY

A system for determining an amount of power supplied from a power amplifier may include a power amplification circuit having a characteristic thermal resistance, a first connection for connecting to a power source, a second connection for connecting to an electronic signal source, and a third connection for connecting to an electronic signal receiver. The system may also include a temperature sensor for measuring a first temperature associated with the power amplification circuit when the power amplification circuit is receiving power from the power source. The system may further include a temperature sensor for measuring a second temperature associated with an environment occupied by the power amplification circuit. The system may also include a processor coupled with the first temperature sensor and the second temperature sensor for determining an amount of power dissipation utilizing (A) a temperature difference determined utilizing the first temperature and the second temperature and (B) the characteristic thermal resistance of the power amplification circuit.

A method for determining an amount of power supplied from a power amplifier may include using a computer or processor to perform the steps of receiving a first temperature associated with a power amplification circuit when the power amplification circuit is receiving power from a power source; receiving a second temperature associated with an environment occupied by the power amplification circuit; and determining an amount of power dissipation utilizing (A) a temperature difference determined utilizing the first temperature and the second temperature and (B) a characteristic thermal resistance of the power amplification circuit.

A device for determining an amount of power supplied from a power amplifier may include a first temperature sensor for sensing a first temperature associated with a power amplification circuit when the power amplification circuit is receiving power from a power source. The device may also include a second temperature sensor for sensing a second temperature associated with an environment occupied by the power amplification circuit. The device may further include a processor coupled with the first temperature sensor and the second temperature sensor for determining an amount of power dissipation utilizing (A) a temperature difference determined utilizing the first temperature and the second temperature and (B) a characteristic thermal resistance of the power amplification circuit.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Figure 1:
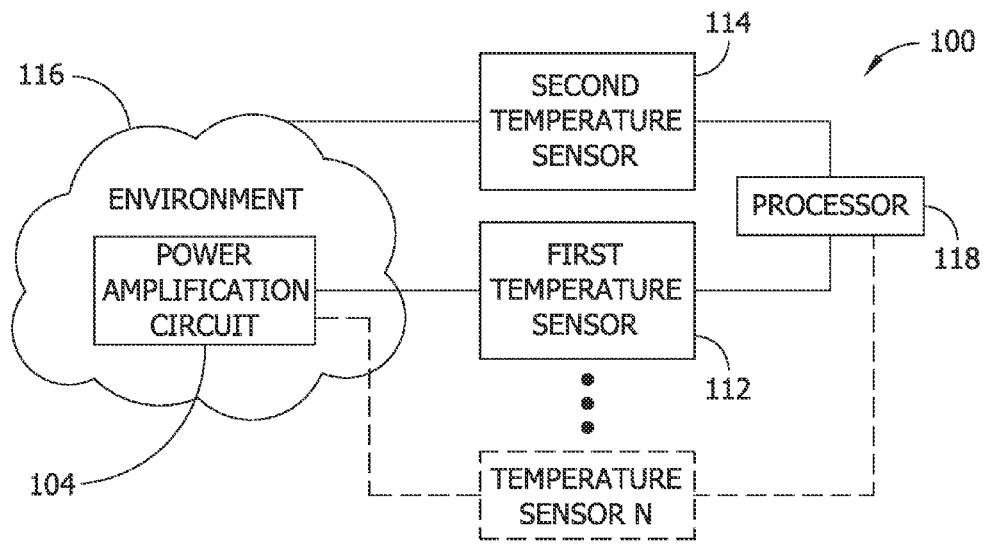
FIG. 1 is a schematic illustrating a system for determining an amount of power supplied by a power amplifier.
Figure 2:
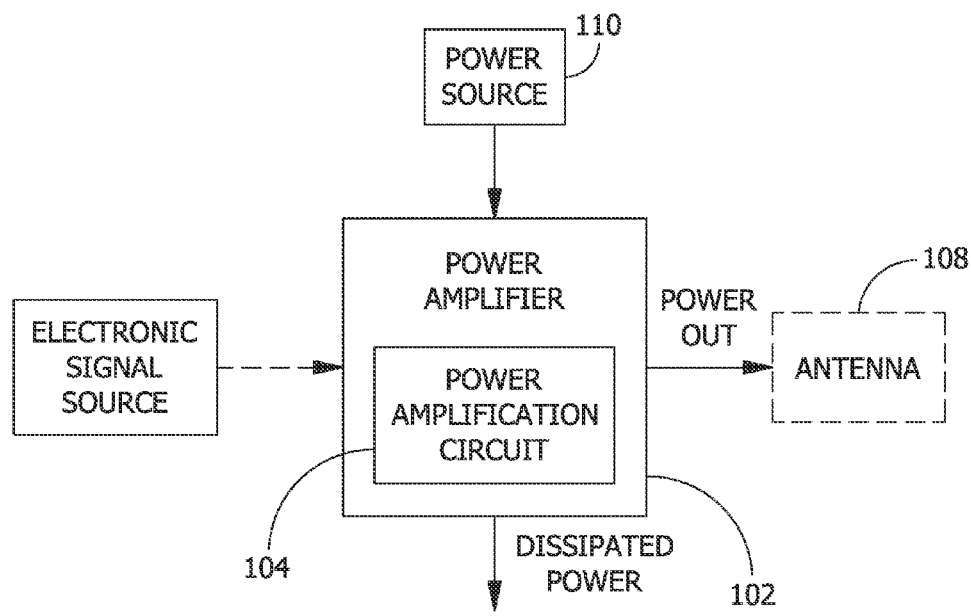
FIG. 2 is a schematic illustrating a power amplifier connected to a power source, an electronic signal source, and an antenna.

Reference will now be made in detail to the subject matter disclosed, which is illustrated in the accompanying drawings.

Referring generally to FIGS. 1 through 6, a system 100 for determining an amount of Radio Frequency (RF) power supplied from a power amplifier 102 is described in accordance with the present disclosure. The power amplifier 102 includes circuitry (e.g., power amplification circuit 104) for amplifying a signal from a signal source (e.g., electronic signal source 106) connected to the power amplifier 102. The amplified signal may be provided to an electronic signal receiver connected to the power amplifier 102, such as an antenna 108, or the like. In embodiments, the power amplifier 102 is also connected to a Direct Current (DC) power source 110 for supplying power to the power amplification circuit 104 for amplifying the signal from the electronic signal source 106.

In example implementations, the power forward from the power amplifier 102 and/or the power reflected back from the antenna 108 may be determined by measuring the power loss from the power amplification circuit 104. Furthermore, a determination of power loss from the power amplification circuit 104 may be performed when the power amplifier 102 is utilized for amplifying signals for constant envelope, ultra-broadband, high power jamming applications, such as jamming performed in the 30 megahertz (MHz) to 6 gigahertz (GHz) (or possibly 18 GHz) range. These high power jamming applications may utilize power levels of between 10 Watts (W) and 100 W. However, it will be appreciated that these ranges are provided by way of example only, and are not meant to limit the present disclosure.

It should be noted that calculating the amount of RF power supplied from the power amplifier 102 may be useful for protecting equipment connected to the power amplification circuit 104, such as the antenna 108. For instance, the measured output power may be provided to instrumentation for alerting a user when the power amplifier 102 is supplied with power while it is not connected to an antenna. It should also be noted that while the power amplifier 102 and the DC power source 110 may be described as separate from one another in the description and accompanying figures, this specific implementation is provided by way of example only, and it will be appreciated that other configurations may be utilized with the present disclosure, including implementations where the power amplifier 102 includes an integrated power source connected to the power amplification circuit 104.

The power amplification circuit 104 has a characteristic thermal resistance. For example, when power is supplied to the power amplification circuit 104, heat may be generated as power is dissipated in the course of operating the circuit. The characteristic thermal resistance may be defined as a measure of the ability of the power amplification circuit 104 to resist this heat flow. In embodiments, the resistance to heat flow is detectable as a temperature change for the power amplification circuit 104, which may be proportional to the amount of power dissipated. This relationship may be expressed as follows:

$$T_1 - T_2 = \Delta T = R_{th}(P_{diss}),$$

where $T_1$ represents a temperature associated with the power amplification circuit 104, $T_2$ represents a temperature associated with an environment occupied by the power amplification circuit 104, $\Delta T$ represents a change in temperature as power is dissipated in the power amplification circuit 104, $R_{th}$ represents the characteristic thermal resistance of the power amplification circuit 104, and $P_{diss}$ represents the power dissipation from the power amplification circuit 104.

The system 100 includes a first temperature sensor 112 for sensing a first temperature associated with the power amplification circuit 104 when the power amplification circuit 104 is receiving power from the DC power source 110. The system 100 also includes a second temperature sensor 114 for sensing a second temperature associated with an environment 116 occupied by the power amplification circuit 104. Additionally, the system 100 includes a processor 118 coupled with the first temperature sensor 112 and the second temperature sensor 114 for determining the amount of power dissipation $P_{diss}$ utilizing (A) the temperature difference $\Delta T$ determined utilizing the first temperature $T_1$ and the second temperature $T_2$ and (B) the characteristic thermal resistance $R_{th}$ of the power amplification circuit 104 (e.g., as previously described).

Figure 4:
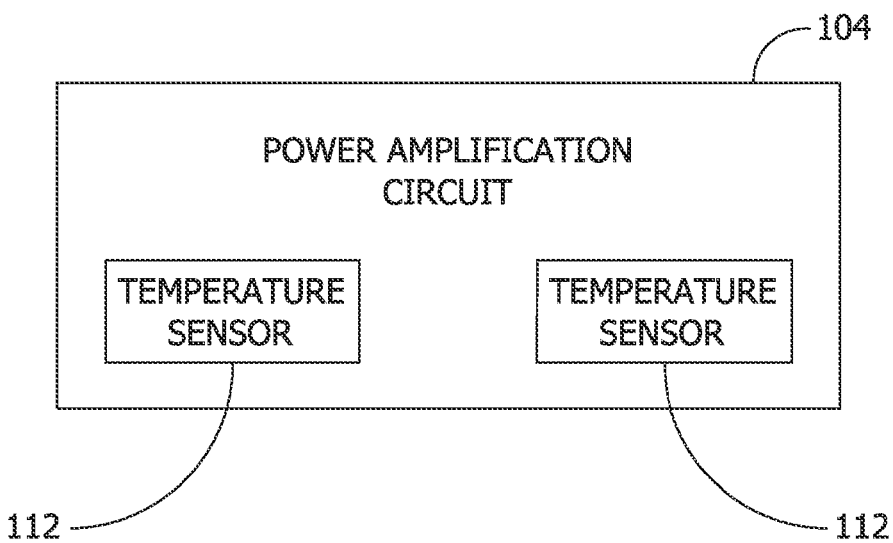
FIG. 4 is a schematic illustrating a power amplification circuit having two integrated temperature sensors.

In embodiments, the first temperature sensor 112 may be included with a group of one or more temperature sensors for sensing a number of temperatures associated with the power amplification circuit 104 (e.g., as illustrated in FIGS. 1 and 4). Then, the temperature difference may be determined utilizing a number of temperature measurements. For instance, multiple temperature measurements may be averaged together. By utilizing more than one temperature associated with the power amplification circuit 104, the accuracy of the measured temperature of the power amplification circuit 104 may be improved, which may improve the accuracy of the determined power dissipation. Additionally, it should be noted that the second temperature sensor 114 may also be included with a group of one or more temperature sensors for sensing a number of temperatures associated with the environment 116 occupied by the power amplification circuit 104. By utilizing more than one temperature associated with the environment 116, the accuracy of the determined power dissipation may be improved.

Figure 5:
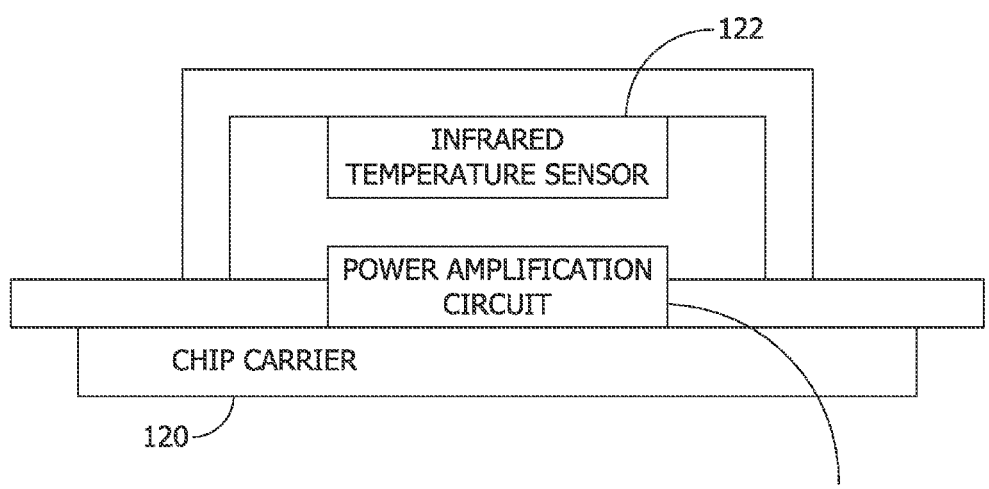
FIG. 5 is a schematic illustrating a power amplification circuit and an infrared temperature sensor.

In some implementations, the temperature of the power amplification circuit 104 and/or the environment 116 may be measured utilizing a non-contact temperature sensor. For example, the first temperature sensor 112 and/or the second temperature sensor 114 may include an infrared temperature sensor provided with a semiconductor package including the power amplification circuit 104. In one specific embodiment, an infrared temperature sensor 122 may be utilized to measure a junction temperature associated with one or more hot spots and/or transistors included with the power amplification circuit 104 (e.g., as illustrated in FIG. 5). It should be noted that utilizing an infrared sensor may provide temperature measurements without degrading the Radio Frequency (RF) performance of the power amplification circuit 104. In other implementations, the temperature of the power amplification circuit 104 and/or the environment 116 may be measured utilizing a contact temperature sensor. For instance, the first temperature sensor 112 and/or the second temperature sensor 114 may include a semiconductor temperature sensor, or the like. In one specific embodiment, multiple temperature sensors may be integrated on the same power amplifier Integrated Circuit (IC) (e.g., as illustrated in FIG. 4).

Figure 3:
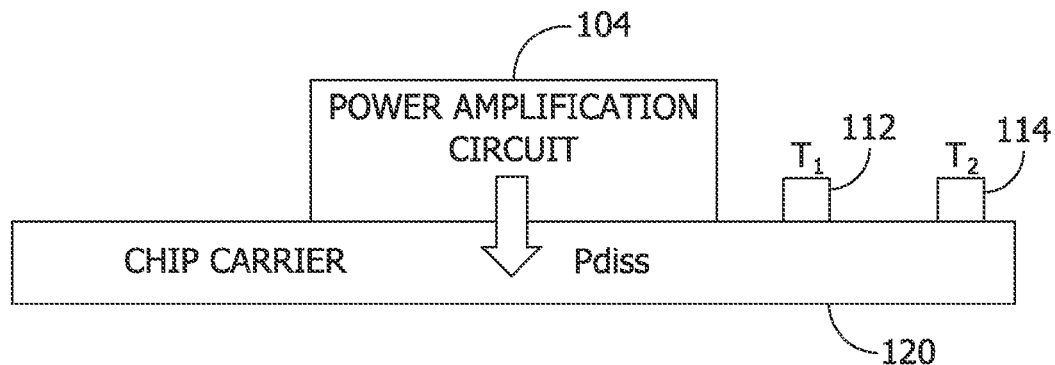
FIG. 3 is a schematic illustrating a power amplification circuit and two temperature sensors positioned on a chip carrier.

In another specific embodiment, a diode-based semiconductor temperature sensor may be utilized to measure a temperature, $T_1$, associated with a location proximal to where a power amplification circuit 104 is mounted to a metal substrate/electrical ground/thermal ground portion of a chip carrier 120, while another semiconductor temperature sensor may be utilized to measure an environment temperature, $T_2$, associated with a distal region of the chip carrier 120 (e.g., as illustrated in FIG. 3). It will be appreciated that various types of temperature sensors may be utilized for sensing the temperature of the power amplification circuit 104 and/or the environment 116, such as a triode-based semiconductor temperature sensor, a transistor-based semiconductor temperature sensor, a thermal resistor/thermistor-type temperature sensor, a thin film temperature sensor, or the like.

In some embodiments, the characteristic thermal resistance of the power amplification circuit 104 may be determined by supplying power to the power amplification circuit 104 without supplying an amplified signal to a receiver, such as the antenna 108. For example, the amount of power dissipated from the power amplification circuit 104 may be at least substantially equal to the power supplied to the power amplification circuit 104 when no signal is supplied from the electronic signal source 106. This relationship may be expressed as follows:

$$P_{dc} = P_{diss},$$

where $P_{dc}$ represents the amount of power supplied to the power amplification circuit 104 by the DC power source 110 (e.g., a Direct Current (DC) power source in the present example), and $P_{diss}$ represents the amount of power dissipation from the power amplification circuit 104. Thus, the system 100 may be calibrated by supplying power to the power amplification circuit 104 without supplying an amplified signal to a receiver. For example, knowing $P_{diss}$ and the resulting $\Delta T$, the thermal resistance may be calculated as follows:

$$R_{th} = \frac{\Delta T}{P_{diss}}.$$

In embodiments, an amount of RF power supplied from the power amplifier 102 to a receiver, such as the antenna 108, may be determined by calculating the amount of power dissipated from the power amplification circuit 104 (e.g., as previously described), and then utilizing the amount of dissipated power to calculate an amount of power supplied to the antenna 108. For example, the power supplied from the power amplifier 102 may be a function of the power supplied to the power amplification circuit 104 from the DC power source 110, the power from the electronic signal source 106, and the power dissipated from the power amplification circuit 104. This relationship may be expressed as follows:

$$P_{out} = P_{dc} + P_{in} - P_{diss},$$

where $P_{out}$ represents the amount of RF power supplied from the power amplifier 102, $P_{dc}$ represents the amount of power supplied to the power amplification circuit 104 by the DC power source 110, $P_{in}$ represents the amount of power from the electronic signal source 106, and $P_{diss}$ represents the amount of power dissipation from the power amplification circuit 104. Further, because the amount of power from the electronic signal source 106 may be minimal in comparison to the other parameters, the relationship may also be expressed as follows:

$$P_{out} = P_{dc} - P_{diss}.$$

Thus, the amount of RF power supplied from the power amplifier 102 to a receiver may be determined by subtracting the power dissipated from the power amplification circuit 104 from the power supplied by the DC power source 110.

Figure 6:
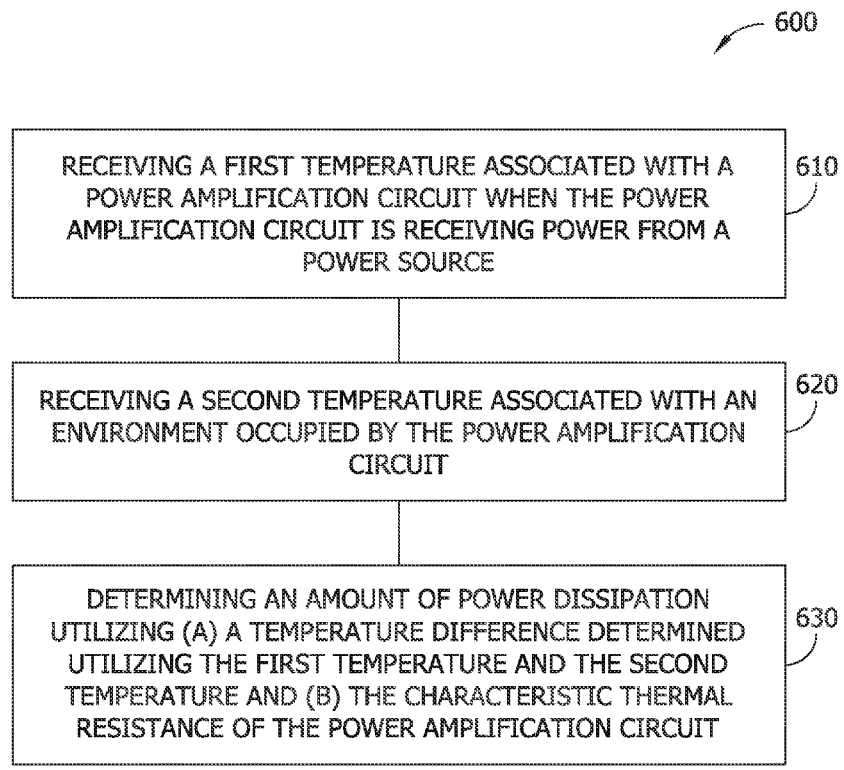
FIG. 6 is a flow diagram illustrating a method for determining an amount of power supplied by a power amplifier.

Referring now to FIG. 6, a method 600 for determining an amount of RF power supplied from a power amplifier may include using a computer or processor to perform the steps of receiving a first temperature associated with a power amplification circuit when the power amplification circuit is receiving power from a power source, 610; receiving a second temperature associated with an environment occupied by the power amplification circuit, 620; and determining an amount of power dissipation utilizing (A) a temperature difference determined utilizing the first temperature and the second temperature and (B) a characteristic thermal resistance of the power amplification circuit, 630.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A system for determining an amount of power supplied from a power amplifier, comprising:
    a power amplification circuit having a characteristic thermal resistance, a first connection for connecting to a power source, a second connection for connecting to an electronic signal source, and a third connection for connecting to an electronic signal receiver;
    a first temperature sensor for sensing a first temperature associated with the power amplification circuit when the power amplification circuit is receiving power from the power source;
    a second temperature sensor for sensing a second temperature associated with an environment occupied by the power amplification circuit; and
    a processor coupled with the first temperature sensor and the second temperature sensor for determining an amount of power dissipation utilizing (A) a temperature difference determined utilizing the first temperature and the second temperature and (B) the characteristic thermal resistance of the power amplification circuit.

2. The system of claim 1, wherein at least one of the first temperature sensor or the second temperature sensor is included with a plurality of temperature sensors for sensing a plurality of temperatures associated with at least one of the power amplification circuit or the environment occupied by the power amplification circuit, and where the temperature difference is determined utilizing the plurality of temperatures.

3. The system of claim 1, wherein the characteristic thermal resistance of the power amplification circuit is determined by supplying power to the power amplification circuit without supplying an amplified signal from the power amplification circuit to the electronic signal receiver.

4. The system of claim 1, wherein the amount of power supplied from the power amplifier is determined by subtracting the amount of power dissipation from an amount of power supplied to the power amplification circuit by the power source.

5. The system of claim 1, wherein the amount of power supplied from the power amplifier is determined by subtracting the amount of power dissipation from an amount of power supplied to the power amplification circuit by the power source and the electronic signal source.

6. The system of claim 1, wherein the characteristic thermal resistance of the power amplification circuit is determined by supplying power to the power amplification circuit without supplying an amplified signal from the power amplification circuit to the electronic signal receiver, the amount of power supplied from the power amplifier is determined by subtracting the amount of power dissipation from an amount of power supplied to the power amplification circuit by the power source.

7. A method for determining an amount of power supplied from a power amplifier, comprising:
    using a computer or processor to perform the steps of receiving a first temperature associated with a power amplification circuit when the power amplification circuit is receiving power from a power source;
    receiving a second temperature associated with an environment occupied by the power amplification circuit; and
    determining an amount of power dissipation utilizing (A) a temperature difference determined utilizing the first temperature and the second temperature and (B) a characteristic thermal resistance of the power amplification circuit.

8. The method of claim 7, wherein at least one of receiving a first temperature associated with a power amplification circuit when the power amplification circuit is receiving power from a power source or receiving a second temperature associated with an environment occupied by the power amplification circuit comprises:

receiving a plurality of temperatures associated with at least one of the power amplification circuit or the environment occupied by the power amplification circuit, where the temperature difference is determined utilizing the plurality of temperatures.

9. The method of claim 7, further comprising:
determining the characteristic thermal resistance of the power amplification circuit by supplying power to the power amplification circuit without supplying an amplified signal from the power amplification circuit to an electronic signal receiver.

10. The method of claim 7, wherein the amount of power supplied from the power amplifier is determined by subtracting the amount of power dissipation from an amount of power supplied to the power amplification circuit by the power source.

11. The method of claim 7, wherein the amount of power supplied from the power amplifier is determined by subtracting the amount of power dissipation from an amount of power supplied to the power amplification circuit by the power source and an electronic signal source.

12. A device for determining an amount of power supplied from a power amplifier, comprising:
a first temperature sensor for sensing a first temperature associated with a power amplification circuit when the power amplification circuit is receiving power from a power source;
a second temperature sensor for sensing a second temperature associated with an environment occupied by the power amplification circuit;
a processor coupled with the first temperature sensor and the second temperature sensor for determining an amount of power dissipation utilizing (A) a temperature difference determined utilizing the first temperature and the second temperature and (B) a characteristic thermal resistance of the power amplification circuit.

13. The device of claim 12, wherein at least one of the first temperature sensor or the second temperature sensor is included with a plurality of temperature sensors for sensing a plurality of temperatures associated with at least one of the power amplification circuit or the environment occupied by the power amplification circuit, where the temperature difference is determined utilizing the plurality of temperatures.

14. The device of claim 12, wherein the characteristic thermal resistance of the power amplification circuit is determined by supplying power to the power amplification circuit without supplying an amplified signal from the power amplification circuit to an electronic signal receiver.

15. The device of claim 12, wherein the amount of power supplied from the power amplifier is determined by subtracting the amount of power dissipation from an amount of power supplied to the power amplification circuit by the power source.

16. The device of claim 12, wherein the characteristic thermal resistance of the power amplification circuit is determined by supplying power to the power amplification circuit without supplying an amplified signal from the power amplification circuit to an electronic signal receiver, the amount of power supplied from the power amplifier is determined by subtracting the amount of power dissipation from an amount of power supplied to the power amplification circuit by the power source.

* * * * *